US005750207A

United States Patent [19]
Hammond et al.

[11] Patent Number: 5,750,207
[45] Date of Patent: May 12, 1998

[54] SYSTEM AND METHOD FOR DEPOSITING COATING OF MODULATED COMPOSITION

[75] Inventors: Mark S. Hammond; Timothy W. McClain, both of Houston, Tex.

[73] Assignee: SI Diamond Technology, Inc., Austin, Tex.

[21] Appl. No.: 390,542

[22] Filed: Feb. 17, 1995

[51] Int. Cl.$^6$ ............................................. H05H 1/24
[52] U.S. Cl. .......................... 427/576; 118/723 VE; 118/723 MP; 118/724; 118/730; 118/500; 427/294; 427/299; 427/404; 427/430.1; 427/580
[58] Field of Search ......................... 427/294, 534, 427/570, 576, 580, 404, 299, 430.1; 118/723 VE, 723 MP, 724, 730, 500

[56] References Cited

U.S. PATENT DOCUMENTS

| | | | |
|---|---|---|---|
| 3,650,714 | 3/1972 | Farkas | 51/295 |
| 3,929,432 | 12/1975 | Caveney | 51/295 |
| 4,399,167 | 8/1983 | Pipkin | 427/217 |
| 4,554,201 | 11/1985 | Andreev et al. | 428/215 |
| 4,776,863 | 10/1988 | van den Berg et al. | 51/295 |
| 4,835,062 | 5/1989 | Holleck | 428/469 |
| 5,103,701 | 4/1992 | Lundin et al. | 82/173 |

(List continued on next page.)

OTHER PUBLICATIONS

Mirkarimi, P.B., et al., "Enhanced hardness in lattice-matched single-crystal TiN/V$_{0.6}$Nb$_{0.4}$N superlattices," Appl. Phys. Lett. 57 (25), Dec. 17, 1990, pp. 2654–2656.

Mirkarimi, P.B., et al., "Elastic properties of TiN/ (V$_x$Nb$_{1-x}$) N superlattices measured by Brillouin scattering," J. Appl. Phys. 71(10), May 15, 1992, pp. 4955–4958.

Sanders, D.M., et al., "Coating Technology Based on the Vacuum Arc—A Review," reprinted from IEEE Transactions on Plasma Science, vol. 18, No. 6, Dec. 1990, pp. 883–894.

Sanders, D.M., "Review of ion-based coating processes derived from the cathodic arc," J. Vac. Sci. Technol. A7 (3), May/Jun. 1989, pp. 2339–2345.

Shinn, M. and S.A. Barnett, "Effect of superlattice layer elastic moduli on hardness," Appl. Phys. Lett. 64(1), Jan. 3, 1994, pp. 61–63.

Sproul, Wm. D., "coatings for enhanced performance," J. Vac. Sci. Technol. A 12(4), Jul./Aug. 1994, pp. 1595–1601.

Torok, E., et al., "Young's Modulus of TiN, ZrN and HfN," Thin Solid Films, 1987, pp. 37–43 (No month avail).

Vetter, J., et al., "Laminated Nanometre Ti/TiN Coatings Deposited by a Reactive Cathodic Arc Technique," Thin Solid Films, 1991, pp. L11–L13, No month avail.

A. Bakon and A. Szymanski, Practical uses of Diamond, Ellis Horwood and PWN–Polish Scientific Publishers, pp. 100–102. (No date avail).

Chu, X. et al., "Deposition and properties of polycrystalline TiN/NbN superlattics coatings," J. Vac. Sci. Technol. A 10(4), Jul./Aug. 1992, pp. 1604–1609.

Helmersson, U., et al. Growth of single-crystal TiN/VN strained-layer superlattices with extremely high mechanical hardness, J. Appl. Phys. 62(2), Jul. 15, 1987, pp. 481–484.

Hultman, L., et al., "Formation of polyhedral voids at surface custs during growth of epitaxial TiN/NbN superlattice and alloy films", J. Vac. Sci. Technol. A 10(4), Jul./Aug. 1992, pp. 1618–1624.

Lux, Benno et al., "Diamond as a Wear–Resistant Coating", Diamond Films and Coatings, pp. 183–243. (No date avail.).

Primary Examiner—Bernard Pianalto
Attorney, Agent, or Firm—Winstead Sechrest & Minick P.C.

[57] ABSTRACT

Apparatus and method are provided for forming coatings of transition metal compounds on solid bodies using cathodic arcs and a reactive gas in a vacuum chamber. The metal composition of the coatings is varied by moving the articles to be coated through the vacuum chamber having cathodes at selected locations, the articles being supported on movable supports.

20 Claims, 5 Drawing Sheets

U.S. PATENT DOCUMENTS

| | | | |
|---|---|---|---|
| 5,127,924 | 7/1992 | Russell | 51/295 |
| 5,133,332 | 7/1992 | Tanaka et al. | 125/39 |
| 5,139,537 | 8/1992 | Julien | 51/293 |
| 5,308,367 | 5/1994 | Julien | 51/293 |
| 5,316,416 | 5/1994 | Kim | 408/145 |
| 5,366,522 | 11/1994 | Nakamura et al. | 51/293 |
| 5,392,759 | 2/1995 | Kwang | 125/15 |
| 5,395,680 | 3/1995 | Santhanam et al. | 428/212 |

DEBURRING OPERATION ON 86B20 STEEL

FIG. 4B

CHAMFERING OPERATION OF SATELLITE

FIG. 4C

CRANKSHAFT MILLING OPERATION ON 8620

FIG. 5

DIAMOND WHEEL DATA (cBN)

SYSTEM AND METHOD FOR DEPOSITING COATING OF MODULATED COMPOSITION

FIELD OF THE INVENTION

This invention relates to apparatus and method for depositing a coating on a solid body. More particularly, a coating of modulated composition of two or more transition metal compounds is deposited on an article of manufacture.

BACKGROUND OF THE INVENTION

Coatings formed on solids of metal or ceramic composition can greatly improve the physical and chemical properties of the solid. Such properties as wear-resistance and corrosion-resistance may be greatly enhanced. Thin metal-based coatings have become widely used in recent years—to increase the wear properties of parts in machinery, of cutting tools, of abrasion tools and for other applications.

Coating technologies employing both chemical vapor deposition and physical vapor deposition have been used. Physical vapor deposition methods have proved to be more versatile, because lower deposition temperatures are usually required. Various types of physical vapor deposition technologies have been developed, most of which include an electric arc. Arc technology has the capability of providing highly ionized coating atoms of the correct energy at the coating interface, where they are needed. The discrete cathode arc, continuously operated, has been demonstrated to be able to coat large size parts in an industrial environment. In particular, cutting tools have been coated with metal nitrides using the discrete continuous cathodic arc. In this application, an arc is started over a water-cooled cathode of the metal, commonly titanium, and the metal reacts with nitrogen which has been introduced into the chamber containing the arc. Stoichiometric titanium nitride can be produced over a range of nitrogen pressures. The coating has commercial interest for extending the life of cutting tools, as a corrosion-resistant coating, and as a decorative coating.

In recent years, coatings based on the formation of a "superlattice" were suggested. These coatings are made up of a large number of individual layers, each layer ranging from 0.5 to 40 nm in thickness. Each layer is comprised of one kind of at least two kinds of crystalline hard substances arranged in a sequentially alternating order, the hard substances having phase interfaces which are at least crystallographically partially coherent. Such superlattice coatings were suggested for use as wear-resistant coatings for metallic substrates in U.S. Pat. No. 4,835,062.

Superlattice layers have been formed for study in the laboratory by placing multiple cathodes of metals to be deposited in the superlattice within a vacuum chamber and rotating bodies to be coated so as to expose one side of the body to the source of ions from the arcs. U.S. Pat. No. 4,835,062, referenced above, discloses one type of geometry used to form such coatings, wherein the solid bodies are placed on a rotating platform and moved beneath spaced apart cathode sources. Chu et al. (*Journal Vacuum Science Technology* A10(4), July/August 1992) discloses other apparatus used to form a superlattice film. A body to be coated is fixed to a rotating cylinder. As the cylinder rotates one side of the body comes to face cathodic arcs of the different metals being deposited. Mirkarimi et al.(*Applied Physics Letters* 57(25), 17 Dec. 1990) describe the use of shutters to modulate fluxes to be used for forming superlattice layers. In all these methods it is not possible to coat uniformly the area of the article which is shadowed from the beam of material being emitted from the cathode and the non-uniform deposition rate on different areas of the body causes a coating of varying thickness to be deposited.

While the apparatus and methods described heretofore are suitable for forming coatings in a small-scale or laboratory operation, such methods are not suitable for commercial operations employing coating of large numbers of articles or large areas with a coating having more uniform thickness. There is need for improved apparatus and methods for forming coatings having more uniform thickness in which the composition is modulated as the film is formed and which can be employed on a commercial scale. Finally, there is need for coatings which do not depend on at least two kinds of crystalline hard substances arranged in a sequentially alternating order, the hard substances having phase interfaces which are at least crystallographically partially coherent.

SUMMARY OF THE INVENTION

Apparatus is provided for depositing a coating of modulated composition of two or more transition metal compounds from a reactive plasma cathodic arc. The apparatus includes a movable carriage which has a rotatable support for articles to be coated attached to the carriage. Speed of movement of the carriage and of the support is variable. The articles to be coated are electrically isolated from the chamber, so that an electrical bias is applied to the articles for ion scrubbing and coating. In one embodiment, a cathode of each of two different metals to be deposited in the coating is placed near the path of the articles as they move in the chamber. In another embodiment, multiple cathodes of each metal are placed near and on each side of the path; the cathodes of the same composition are preferably offset by a selected angle along the path of movement of articles. Electrodes are spaced in such a way that predominantly one metal is deposited in one segment along the path of the articles and predominantly a second metal is deposited in a separate segment along the path of the articles, so that coatings of modulated composition are formed in the vacuum chamber. The carriage may move in rotational motion or may move through the chamber in other patterns. Heaters may be provided in the chamber for heating articles to be coated to a selected range of temperature.

Method is provided for forming a coating of modulated composition of two or more transition metal compounds by a reactive plasma cathodic arc. In one embodiment, the articles to be coated are placed in the chamber and are rotated as they move through plasmas from at least two cathodes, each of a different transition metal, while a negative electrical potential is applied to the articles and an inert gas and a reactive gas pressure are kept at selected values. Preferably, at least two electrodes of each transition metal are placed in the vacuum chamber, so that the plasma is directed to opposite sides of the path of the articles, and selected values of pressure, temperature, electrical bias and gas composition are maintained in the chamber. The speed of movement of the carriage may be adjusted so as to form a coating having a selected distance within the coating of the same composition of the metals. In another embodiment, an adhesion layer of a metal is formed on the article to be coated before the coating of modulated composition is deposited. Further, method is provided for cleaning the articles in aqueous solutions or by ion scrubbing before deposition of the metal adhesion layer. In one embodiment, the transition metals are titanium and zirconium and the reactive gas is nitrogen.

A protective coating of selected thickness is disclosed comprising a modulated composition of transition metal compounds deposited from a cathodic arc using the apparatus and method of this invention. The transition metals may be titanium and zirconium. The metal composition of the coating has approximately a sinusoidal variation with distance through the coating, the phase difference between the composition curves for different metals being about 180 degrees.

DETAILED DESCRIPTION OF PREFERRED EMBODIMENT

Figure 1:
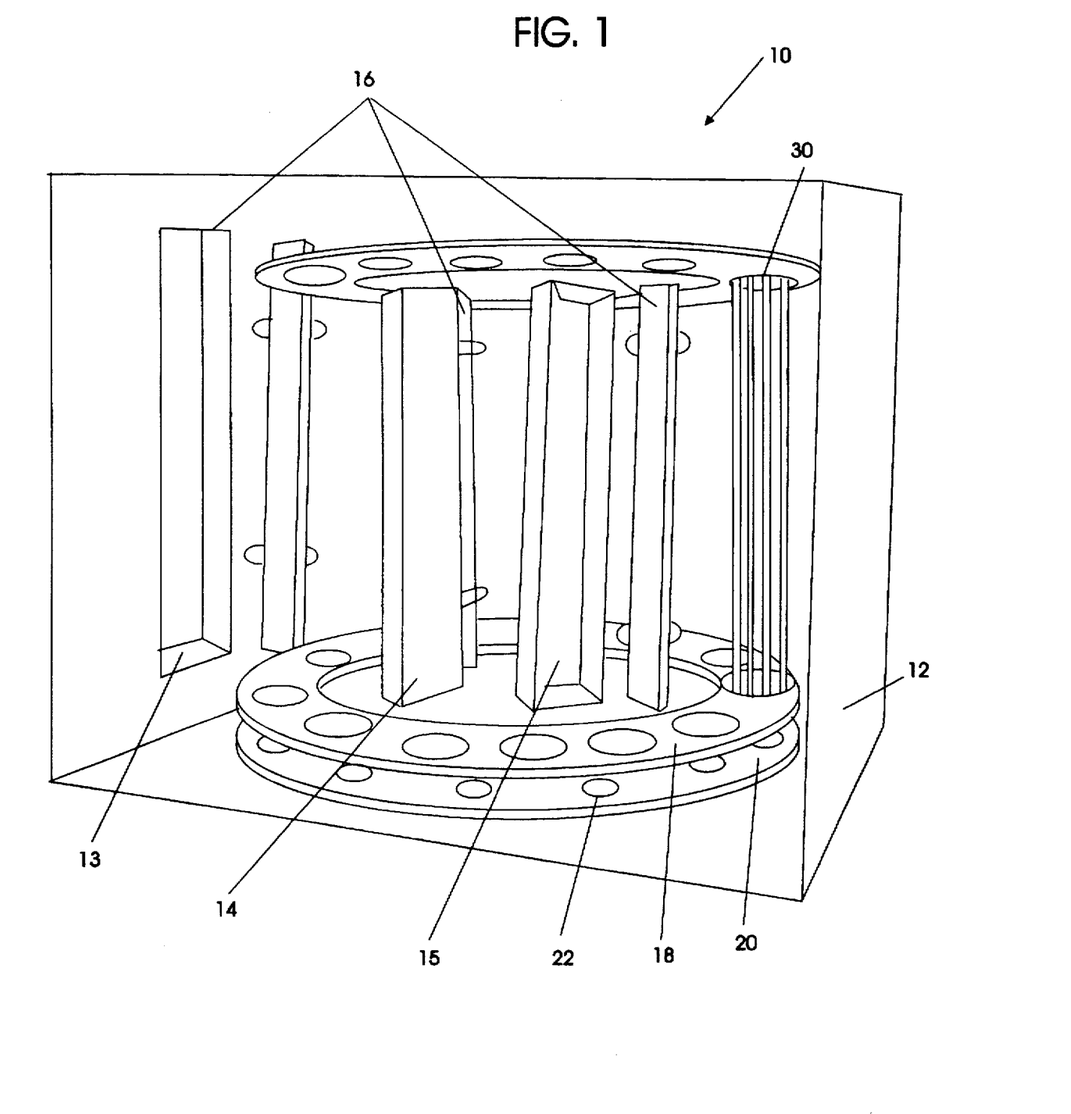
FIG. 1 is an isometric sketch of a vacuum chamber having a rotating carriage with rotating support members having a path of motion through multiple cathodic arcs.

Referring to FIG. 1, a sketch of apparatus 10 of this invention is shown. Vacuum chamber 12 is evacuated by vacuum pumps (not shown). Access to chamber 12 may be through doors, upon which cathode assemblies such as 13 may be mounted. Cathode assembly 14 has the same metal cathode as does cathode assembly 13. Assemblies 13 and 14 are on opposite sides of the path of articles to be coated and are offset along the path of motion of articles, as will be further discussed hereafter. A third cathode assembly 15 is directed approximately 180° from cathode assembly 14, and has a cathode of different transition metal than the metal of cathode assemblies 13 and 14. A fourth cathode assembly is not shown in FIG. 1, for greater clarity, but would preferably be located outside the path of motion of articles to be coated and offset along the path of motion of articles to be coated. Turntable 20 is mounted for rotation about its axis and is driven by power from below the vacuum chamber, as will be more fully described below. Electrical insulators 22 isolate carriage 18 from turntable 20, so that electrical bias voltage can be applied to carriage 18, which is electrically conducting. Sample mounting supports 30, also electrically conducting, are supported by carriage 18. Articles of manufacture are fixed to supports 30 by set screws, by placing rods of mounting supports 30 through holes in the articles, by compressing the articles between end pieces, by magnets, or by other means of attachment. Anodes 16 are fixed at a selected distance from each cathode, usually at a distance of from 2 to 3 inches from one edge of the cathode. Both anodes 16 and cathode assemblies 14 are preferably cooled by circulation of water through the interior of the electrodes. A stainless steel rectangular cross-section duct is suitable for an anode.

Although circular motion is illustrated in FIG. 1, it should be understood that the apparatus of this invention is not limited to a circular or rotating carriage or rotating support members. For example, a carriage may traverse chamber 12 by movement along a track having a selected path, the carriage being supported at the top or bottom of chamber 12. Mounting supports 30 may be attached to the carriage to be moveable around the axis of the supports, but they may move in limited angular excursions driven by gears, vibratory motion of the carriage, or by other means for sweeping an article attached to the supports over an angle to expose different areas of the article to the plasmas through which it moves.

Figure 2:
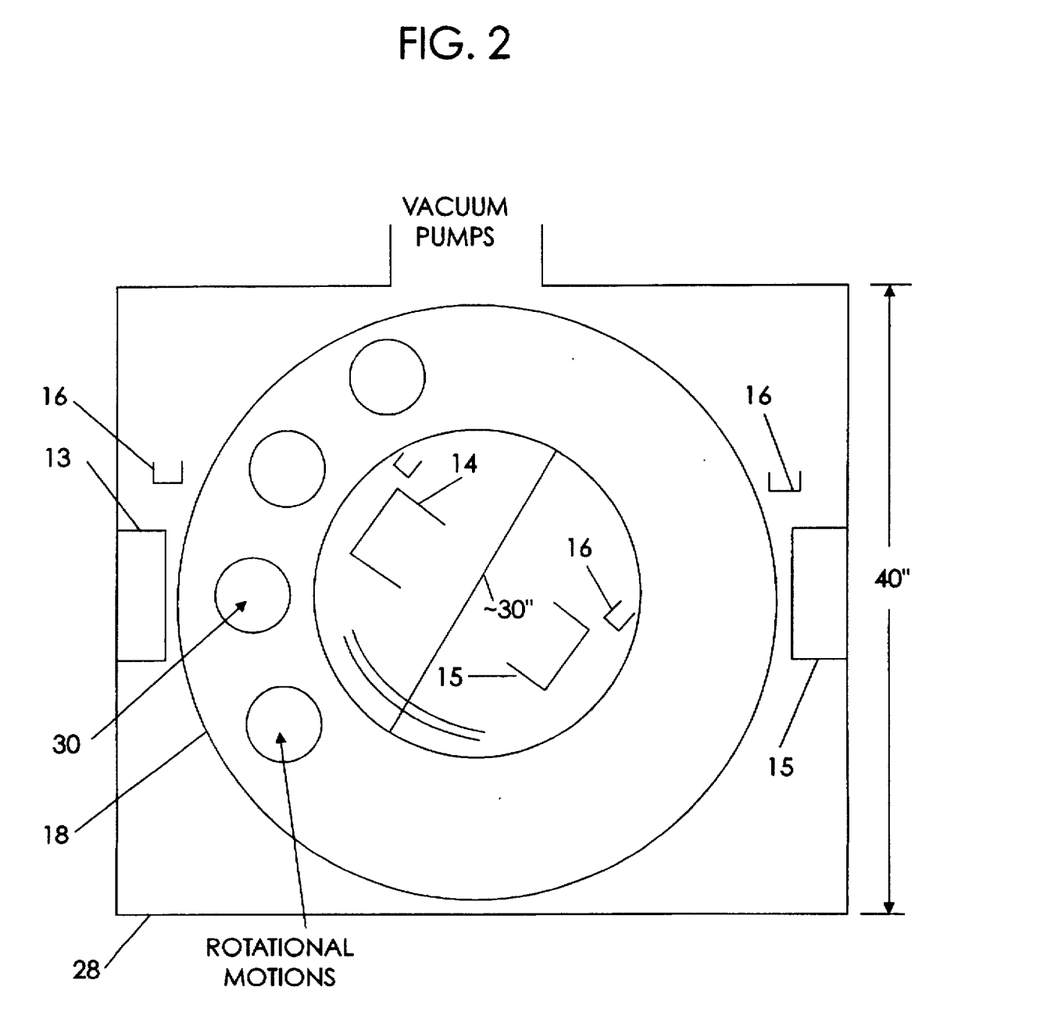
FIG. 2 is a top view of the chamber of FIG. 1.

FIG. 2 shows a top view of the chamber shown in FIG. 1. Rotational motion of carriage 18 and of support members 30 is shown. Placement of electrodes is more clearly seen to be such that cathode assemblies 13 and 14 are offset along the path of movement of support members 30. The angle of offset can be in the range from 0° to 90°, but is preferably from about 35° to about 55°.

Sample support members 30 are preferably rotated within the chamber by any of several means. Rotational motion may be imparted by a mechanical or electromechanical tripping mechanism which is fixed at one of more locations along the path of the support members. Alternatively, rotational motion may be imparted by planetary gears operating on carriage 18 to cause rotation or angular displacement of support members 30. Other mechanical or electromagnetic means may be used. Support members 30 preferably move such that the thickness of coatings is approximately uniform over the body to be coated and shadowing of areas to be coated is minimized. Preferably different areas of an article will be aligned in the direction of cathodes 14 as the article passes the same cathode on successive revolutions.

Gas inlets such as inlet 28 may be placed in corners of the vacuum chamber 12. Radiant heaters 24 are used for preheating samples before coating and for assistance in outgassing apparatus within vacuum chamber 12.

Figure 3:
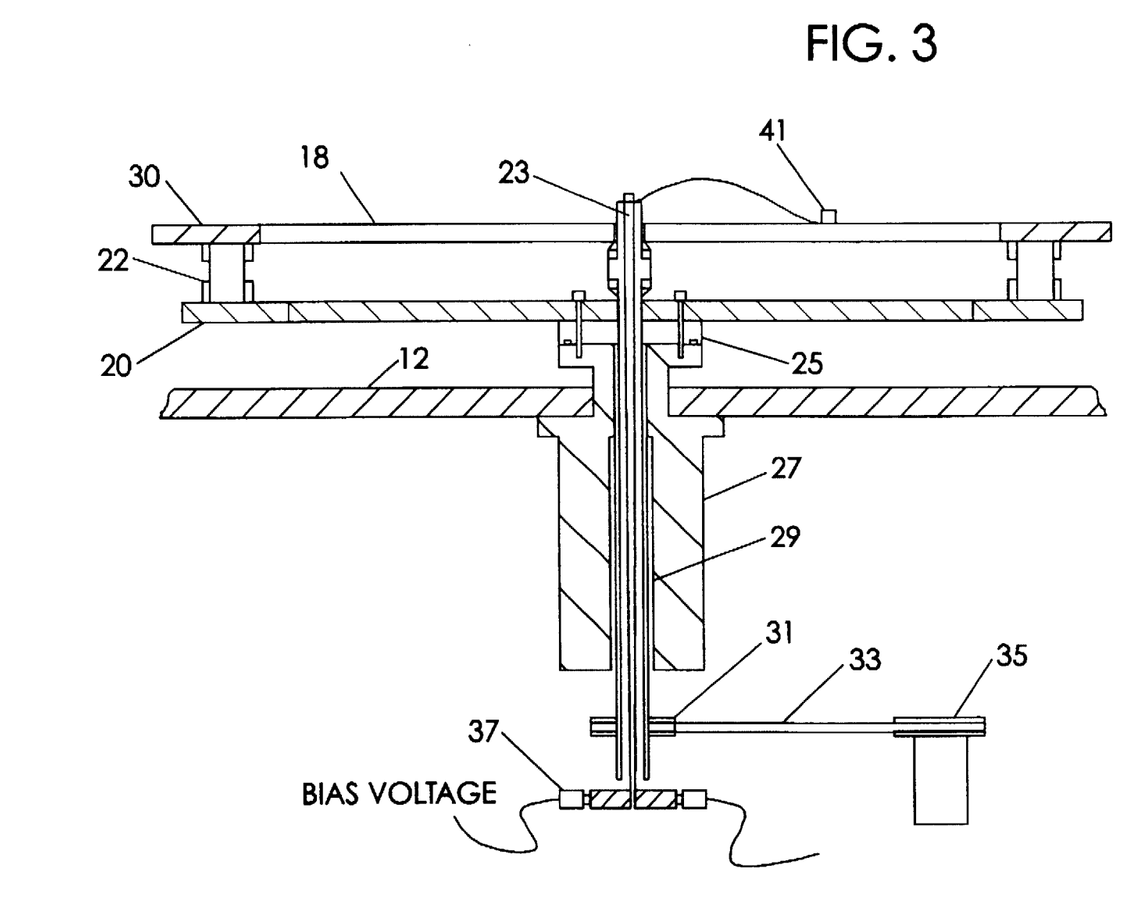
FIG. 3 shows details of a means for moving electrically biased articles through a plasma for coating.

Details of means for rotating turntable 20 and carriage 18 while electrically biasing the articles to be coated are shown in FIG. 3. Carriage 18 is electrically insulated from turntable 20 by insulators 22. Central support electrode 23 is biased through electrical slipring and brush assembly 37 and is electrically connected to carriage 18 at electrical connection 41. Turntable 20 is attached to central support 25, which is rotated through ferrofluidic seal 29 and ferrofluidic drive 27. The drive for rotation comes from drive pulley 31, drive belt 33 and motor 35. Other forms of gears and drive mechanisms, all well-known in industry, may be used.

Although two cathodes of each metal are shown in FIGS. 1 and 2, one cathode inside the circular path of motion of support members 30 and one cathode outside the path, it should be understood that only one cathode of each metal may be used or, alternatively, more than two cathodes of each metal may be used. Cathodes may be aligned end-to-end to form a longer region for coating or the diameter of rotating members may be increased to allow more volume for coating. It is important, however, that the plasma composition through which sample supports 30 pass varies during a cycle of rotation. This variation of plasma composition, the plasma of each metal being emitted from each cathode, will cause deposition of coatings having a modulated composition.

It was found by transmission electron microscopy of coatings deposited by the method and apparatus of this invention, wherein the electrode configuration of FIG. 1 and 2 was used, that coatings of strongly modulated composition were formed. When coatings of modulating compositions of titanium nitride and zirconium nitride were formed, an alloying appeared to be present in the transition zones between the compositions. The composition of each compound appeared to vary sinusoidally with distance through the coating, neither compound being present at 100 per cent concentration, with the curves of composition of the different compounds having a phase difference of 180 degrees.

A preferred procedure for depositing coatings or films having modulated composition includes cleaning articles to be coated before they are placed in the vacuum. This cleaning step preferably includes degreasing in a detergent solution, rinsing in pure water, immersion in an alkaline solution with ultrasonic agitation, a pure water rinse, immersion in a heated acidic solution, a pure water rinse and repeated immersion in pure water. Articles are preferably then dried and stored until placed in the vacuum chamber. Storage is preferably in a box overpressured with pure nitrogen.

After articles are loaded in vacuum chamber 10, pumpdown is begun. When a target pressure, generally less than $10^{-4}$ torr, is reached, radiant heaters 24 are activated. From this step forward, articles to be coated are preferably kept moving in planetary motion as provided by apparatus 10. The time required up until this point depends on the size of the load in the chamber, the thermal mass of the samples and the desired deposition temperature. Temperature-sensitive articles can be coated at lower temperatures, but preferably coating occurs in the temperature range of 450° to 600° C. Radiant heaters 24 are kept on throughout the following steps if high-temperature deposition is desired.

When articles are at a desired temperature, an argon ion etch is preferably carried out. This step consists of a stepwise increase of article bias-voltage in an atmosphere of several tens of millitorr pressure of pure argon gas. The voltage creates a plasma discharge in the argon gas and the negative polarity of the article bias attracts argon ions to the article surfaces, creating an ion "scrubbing" action. After the samples have been ion-bombarded, one or more of the arcs are struck. If titanium is one of the metals used, for example, the titanium arc sources are struck. At this stage only pure argon gas is allowed in the chamber (at a pressure of several millitorr) and the articles are held at a negative bias. The article surfaces are thereby subjected to the simultaneous bombardment of argon and titanium ions. The argon, being inert, serves only to compact the titanium ions into a pure titanium film. Argon is not incorporated into the growing film in any appreciable amount. This pure titanium layer forms an adhesion layer upon which the bulk of the film is grown. This adhesion layer is generally 5 to 25 nm thick. The adhesion layer can also be any other metal used as a cathode, such as zirconium, or a mixture of metals may be used, such as titanium and zirconium.

After the adhesion layer is deposited, the bulk of the coating having modulated composition is deposited. The arc sources are deactivated and the argon gas flow is augmented with a percentage of nitrogen gas or any other reactive gas to be used. Again, the articles are held at a negative bias voltage. When steady gas flows and the target total pressure (several millitorr) of the chamber is reached, all arc sources in chamber 12 are struck. During this step, if titanium and zirconium targets are used, the articles are coated with a layer consisting of predominantly titanium nitride (if nitrogen is introduced to the chamber) layer while passing between the titanium targets and with a layer of predominantly zirconium nitride while passing through the zirconium target segment of the chamber. The thickness of each individual predominantly titanium nitride and zirconium nitride layer is governed by the evaporation rate of the arc source (which is related to the arc current) and the rotational speed of the carriage. Individual layer thicknesses of about 0.5 nm to about 100 nm are preferably formed in this fashion by adjusting arc current and rotational speed. This coating step is continued until a desired thickness of a coating having modulated concentrations of titanium nitride and zirconium nitride has been deposited. Generally, film thicknesses in the range from about 0.5 micrometers to about 30 micrometers are preferred.

Preferable operating conditions are in the following ranges:

Article temperatures from about 100° C. to about 500° C.

Article bias voltage from −100 volts to −1000 volts

Gas mixture composition from about 20 to about 80% nitrogen in a mixture with argon to produce nitride coatings Gas mixtures of 2 to 20% acetylene, and 20 to 70% nitrogen and a balance of argon to produce carbonitride coatings Gas pressures from about 2 to about 20 millitorr Article bias voltage and current for etch from −200 to −1000 volts and 0.5 to 1.5 ampere Article bias and current for deposition from −100 to −1000 volts and currents from 10 to 60 amperes Arc voltage and currents from 25 to 65 volts and 100 to 200 amperes More preferred ranges of the variables described above are as follows:

Gas mixtures from about 50 to 70% nitrogen and a balance of argon (for nitride coatings). For boride mixtures, borane could be used; however borane is poisonous and extra gas-handling facilities are necessary.

Gas mixtures from about 8% to about 14% acetylene and 50 to 60% nitrogen and a balance of argon for carbonitride coatings Gas pressures from about 8 to about 11 millitorr Article bias and current for etching from −300 to −700 volts and 0.6 to 1 ampere Article bias and current for deposition from −175 to −600 volts and 15 to 40 amperes Arc voltage from 25 to 45 volts and currents from 115 to 145 amperes Suitable cathode assemblies for the method of this invention are available from Vacuum, Inc. of Boulder, Colo. and Plasma und Vakuum Technik GmbH of Weiterstadt, Germany. Model V600 of the latter company is particularly suitable. Cathodic arc equipment that can be modified to produce the apparatus of this invention is available commercially from Hauzer TechnoCoatings of Venlo, Holland or Plasma und Vakuum Technik GmbH of Weiterstadt, Germany. Equipment based on the method of this invention may be scaled to whatever size needed for most economical deposition of films of modulated composition. Cathode assemblies may be placed such as to form a coating zone of desired size. Large coating machines may be constructed using the apparatus and methods of this invention.

Various types of tungsten carbide machining inserts and shank tools of differing content and carbide grade were coated by the apparatus and method of this invention. Various grades of high speed steel tools such as broaches, end mills, drills, taps and splines were coated. M2 steel gauging tools were coated. The total surface area of any tool or item which does not include recesses in excess of about twice the critical dimension of the entrance to the recess can be coated. Advanced ceramic tools such as aluminum oxide, silicon carbide and silicon nitride can be coated. Diamond and cubic boron nitride tools were coated, including metal coalesced grinding tools, high-temperature high-pressure coalesced polycrystalline tools and single crystal tools.

Coating runs are continued until a coating of desired thickness is achieved. Typically, coating runs are about 5½ hours, including time for pumpdown, heatup, etch, undercoat, coat and cooldown, to produce a coating thickness of about 4 to 5 micrometers. A coating greater than 10 micrometers was produced in 9 to 10 hours. Coatings having a thickness of greater than 3 microns are preferred. In coating typical carbide inserts for cutting tools, 3500 inserts were loaded in a vacuum chamber having a volume of about 1 m$_3$ and coated in one run.

The samples are preferably rotated past the coating zones at such a rate that the distance between the same composition in the coating, or the wavelength of the sinusoidal variation of metal composition in the coating, is in the range from about 1 nm to about 30 nm, and more preferably is in the range from about 8 nm to about 10 nm. Calculations of wavelength are performed based upon the calculated and measured coating rate from each ion source.

Any transition metals may be placed into a coating by the apparatus and method of this invention. Titanium nitride and zirconium nitride coatings of modulated composition have been shown to have suitable properties, as will be described hereafter. Titanium and zirconium films are normally less expensive than other films of transition metals because of lower prices of cathodes of these metals.

The polarity of the potential placed on the parts to be coated is such that positive ions (metal vapor ions, nitrogen ions and argon ions) are attracted to the part to be coated. The potential may be DC. RF or pulsed DC are preferred for non-conductive articles and may also be used for conductive articles. To produce carbonitride materials, the same procedures are followed but acetylene is included in the gas mixture introduced into the vacuum chamber.

Results of wear tests using articles coated by the method of this invention show the advantages of the coating produced compared with prior art coatings.

EXAMPLE 1

On an AN-50 carbide article, a coating of titanium nitride and zirconium nitride was formed having a thickness of 4 micrometers. This milling cutter was used on a Komatsu milling machine used to produce crank shafts. An 8620-type steel forging was being machined by an interrupted cut. The prior art cutting tool was coated with titanium nitride and, when all edges were used, 800 pieces were cut during the tool life. Using the AN-50 tool coated with a coating of titanium nitride and zirconium nitride, formed using the apparatus and most preferred methods of this invention, 2200 pieces were cut with one cutting tool. It is clear from these results that the coated tool produced by the method of this invention increased useful life of the cutting tool by almost three-fold over the prior art coating.

EXAMPLE 2

Figure 4A:
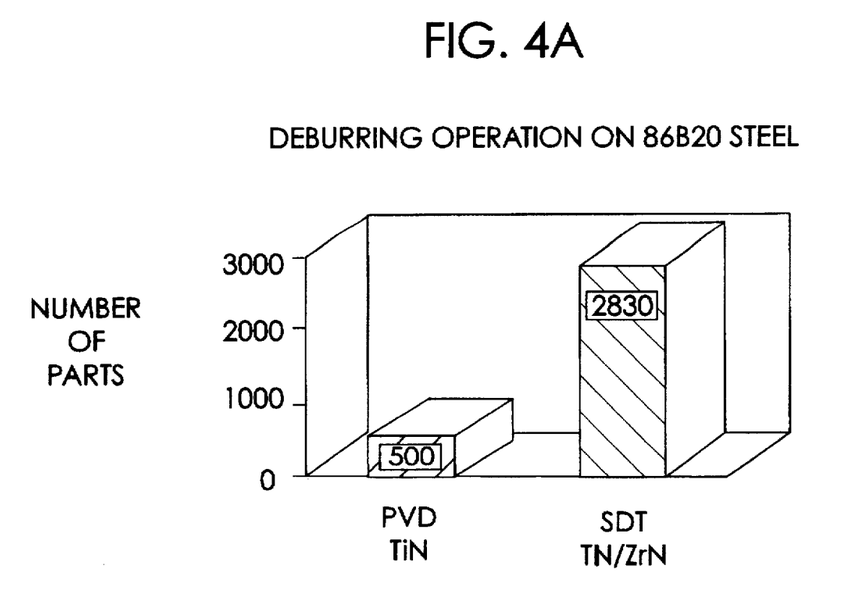
FIGS. 4A, 4B and 4C show a comparison of wear properties of tungsten carbide cutting tools having different coatings and used in different operations.
Figure 4B:
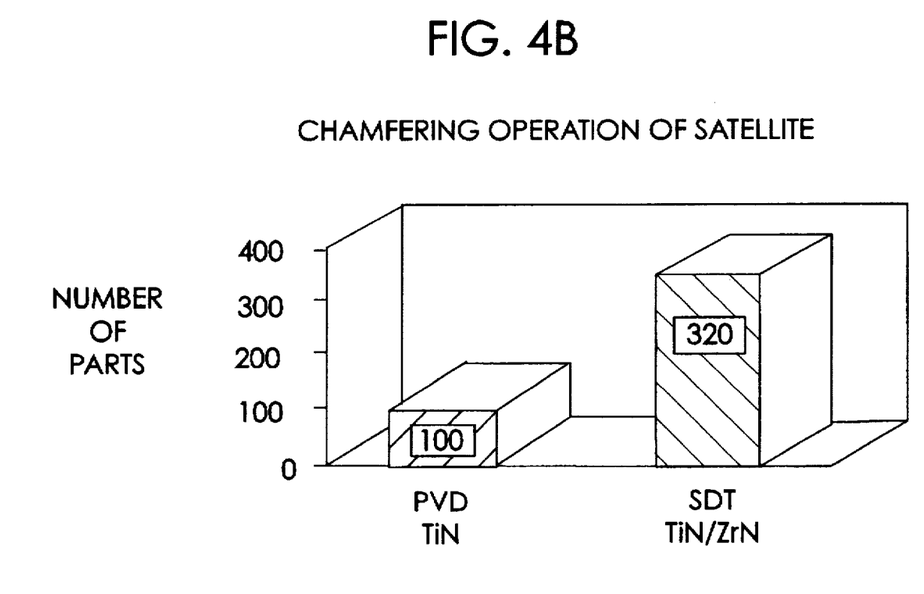
Figure 4C:
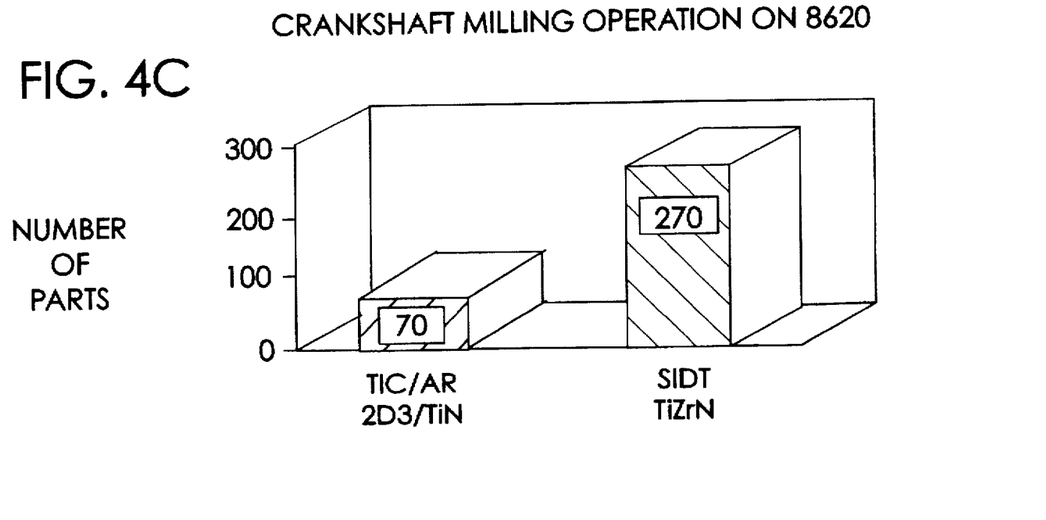

FIGS. 4A, 4B and 4C show results of a number of parts machined using tungsten carbide cutting tools in different operations, comparing tools coated with prior art coatings with tools coated according to the apparatus and method of this invention. As shown in FIG. 4A, a deburring operation on 86B20 steel with a prior art titanium nitride coating allowed the tool to be used for 600 parts, whereas the tool having a coating of modulated composition titanium nitride and zirconium nitride, formed by the method of this invention, lasted for 2830 parts. In FIG. 4B, results for a chamfering operation of stellite is compared, wherein the prior art coating produced 100 parts during the tool life and the tungsten carbide cutting tools coated by the method and apparatus of this invention allowed 320 parts to be produced. In FIG. 4C, in a crankshaft milling operation on 8620 steel, the number of parts to be produced with one tool was increased from 70 with the prior art coating to 270 with the tool coated with modulated composition of titanium nitride and zirconium nitride by the method of this invention.

EXAMPLE 3

Figure 5:
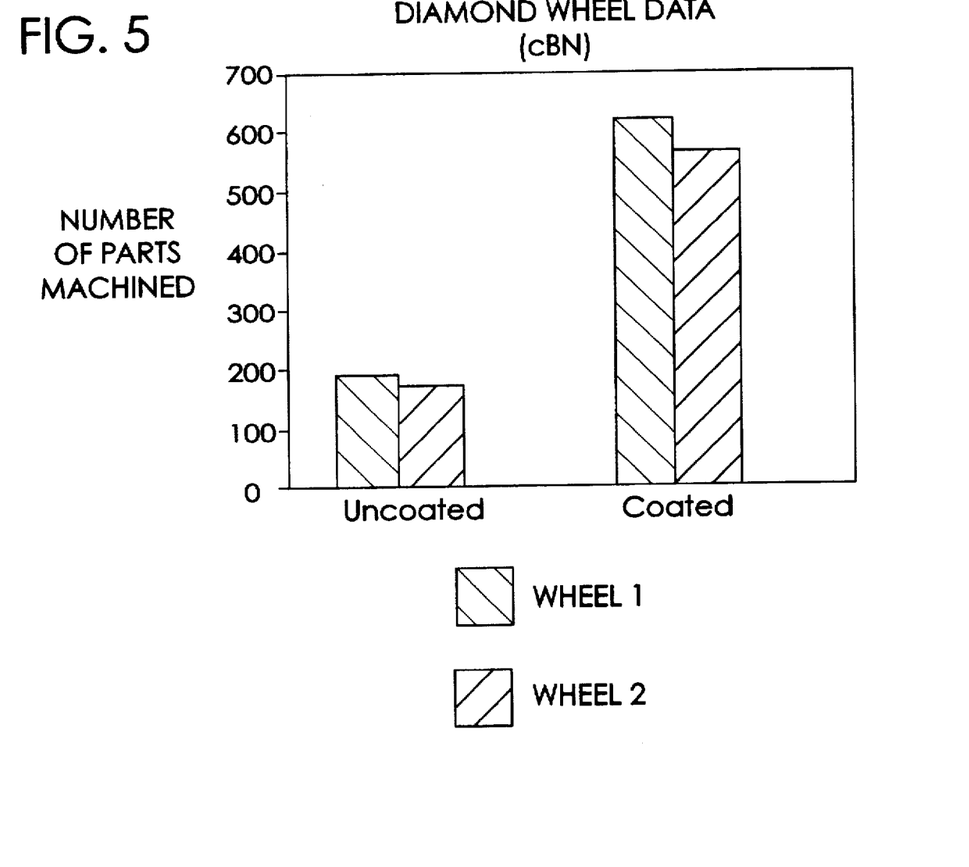
FIG. 5 shows a comparison of wear properties of uncoated and coated diamond grinding wheels.

Referring to FIG. 5, the number of parts machined by "Superabrasive" wheels containing diamond and cubic boron nitride grit was increased from an average of about 190 parts with an uncoated wheel to about 600 parts with a wheel coated with a modulated composition of titanium nitride and zirconium nitride formed by the apparatus and method of this invention.

What is claimed is:

1. Apparatus for depositing a coating of a modulated composition of transition metal compounds from a reactive plasma cathodic arc on to articles, comprising:

a vacuum chamber having inlets for controlling entry of a selected gas;

a movable carriage;

a movable support member attached to the carriage, the support member being electrically isolated from the chamber and adapted to support articles to be coated;

a plurality of cathode assemblies, at least one cathode being of a composition different from the composition of a second cathode, the cathode assemblies being placed so as to form a plasma in the region along the path through which the movable support member passes when the carriage is moved, the cathode assemblies being spaced apart along the path;

an anode; and means for moving the carriage and the support member.

2. The apparatus of claim 1 further having at least two cathodes of each composition, the cathodes of the same composition being on opposite sides of the path along which the rotatable support members pass.

3. The apparatus of claim 2 wherein the cathodes of the same composition are offset along the path along which the movable support members pass.

4. The apparatus of claim 3 wherein the path along which the movable support members pass is circular and the cathodes are offset by an angle in the range from about 35 to about 55 degrees.

5. The apparatus of claim 1 wherein the movable support members are moved such that different areas of an article supported thereby will be aligned in the direction of a cathode on successive movements through the region through which the movable support members pass.

6. The apparatus of claim 1 further comprising radiant heaters within the vacuum chamber.

7. A method for forming a coating of modulated composition of two or more transition metal compounds on an article by a reactive plasma cathodic arc, comprising the steps of:

(a) fixing the article on a support member, the support member being attached to a movable carriage in a vacuum chamber, such that the support member is movable about its axis and is electrically isolated from the movable carriage;

(b) reducing the pressure in the vacuum chamber to a selected value and introducing an inert gas into the chamber to a selected pressure;

(c) applying a negative electrical potential to the support member;

(d) forming at least two cathodic arcs at selected spaced apart locations along the path of the support member and at selected distances therefrom, the cathodic arcs having cathodes of different transition metals;

(e) supplying a selected amount of a reactive gas in a mixture with an inert gas to the vacuum chamber; and (f) simultaneously moving the carriage and the support member to cause the article to pass near the arcs of the different transition metals until a coating of a selected thickness, comprising reaction products of the transition metals, is formed.

8. The method of claim 7 wherein the transition metals are titanium and zirconium.

9. The method of claim 7 wherein the reactive gas is selected from the group of gases comprising nitrogen, acetylene and borane.

10. The method of claim 9 wherein the reactive gas is nitrogen.

11. The method of claim 7 wherein at least four cathodic arcs are formed, at least two cathodes of each composition, the cathodes of the same composition being on opposite sides of the path along which the movable support members pass.

12. The method of claim 11 wherein the cathodes of the same transition metal are offset along the path along which the movable support members pass.

13. The method of claim 7 wherein before the article is fixed to the support member it is cleaned by immersion in aqueous cleaning solutions.

14. The method of claim 7 wherein the electrical potential of step (c) is increased for a time sufficient to clean the article by ion scrubbing before step (d).

15. The method of claim 7 further comprising the step after step (c) and before step (d) of striking an electrical arc of a cathode and depositing an adhesion layer on the article, the adhesion layer being a transition metal or mixture of transition metals.

16. The method of claim 15 wherein the adhesion layer is deposited to a thickness in the range of 5 micrometers to 25 micrometers.

17. The method of claim 7 wherein a heater within the vacuum chamber is activated before step (d).

18. The method of claim 7 wherein the inert gas is argon.

19. The method of claim 7 wherein the negative electrical potential applied in step (d) is in the range from 100 to 1000 volts.

20. The method of claim 7 further comprising the step of adjusting the speed of movement of the support member to form a coating having a selected distance between locations in the coating having the same composition of metal.

* * * * *